United States Patent [19]

Halstead

[11] 4,173,375
[45] Nov. 6, 1979

[54] REMOTE LUBRICATION SYSTEM FOR VERTICAL MOTOR SHAFTS

[75] Inventor: Kenneth G. Halstead, Raleigh, N.C.

[73] Assignee: Westinghouse Electric Corp., Pittsburgh, Pa.

[21] Appl. No.: 896,415

[22] Filed: Apr. 14, 1978

[51] Int. Cl.$^2$ .............................................. F16C 17/00
[52] U.S. Cl. .................................. 308/134.1; 308/132; 308/240
[58] Field of Search ...................... 308/134.1, 132, 125, 308/111, 82, 102, DIG. 5, 104, 87 R, 240

[56] References Cited

U.S. PATENT DOCUMENTS

| | | | |
|---|---|---|---|
| 1,982,937 | 12/1934 | Walter | 308/134.1 X |
| 2,571,672 | 10/1951 | Bradley | 308/132 |
| 2,668,086 | 2/1954 | Marzolf | 308/132 |

Primary Examiner—Douglas C. Butler
Attorney, Agent, or Firm—R. W. Smith

[57] ABSTRACT

A rotatable shaft has an extended vertical length radially supported by a lubricant impervious bearing. Lubricant is transferred upward to the shaft bearing surface by capillary attraction from an absorbent washer surrounding the bottom of the bearing. A wick conveys the lubricant to the washer from a lower lubricant reservoir. A seepage barrier is further included having a wick extending across the open end of an upright support column and against the shaft at the outer end. The wick returns any lubricant discharged from the end of the support column to an absorbent retainer.

3 Claims, 5 Drawing Figures

REMOTE LUBRICATION SYSTEM FOR VERTICAL MOTOR SHAFTS

BACKGROUND OF THE INVENTION

1. Field of the Invention

This invention relates to an improved lubrication system for vertical motor shafts, and such a system using capillary attraction to direct lubricant to a bearing surface remotely located from the lubricant reservoir and particularly intended for use in timing motor driven devices such as watt demand meters subject to continuous and extended operation.

2. Description of the Prior Art

It is known to direct lubricant to a shaft bearing by capillary attraction where a reservoir of lubricant is below the shaft bearing surface. When a vertical shaft is journaled for rotation within the bore of a hollow support, lubricant will rise from a lubricant pool surrounding the bottom of the support. Substantial height of a bearing above the reservoir requires very close tolerances between the shaft receiving bore and the shaft with critical close alignment of the shaft within the bore, which is possible only when critical dimensions are provided along the shaft and the associated bore. When the aforementioned critical considerations are maintained, lubricant will flow upward by capillary attraction through the narrow cylindrical space between the shaft and the bore. Excessive variations in the shaft and bore dimensions or misalignment of the shaft and the bore can create a discontinuity or air pocket in the capillary flow. A discontinuity prevents any capillary flow in the hollow cylindrical column of lubricant above the discontinuity. When the upward flow is blocked, the bearing supporting surface will not receive the lubricant and failures occur quickly in a shaft rotating continuously at relatively high speeds.

The aforementioned critical capillary lubrication systems are sometimes required in synchronous timing motors. These timing motors are used in various devices including timing mechanisms for watt demand meters and demand indicators to which the present invention is particularly intended. In one hysteresis type of synchronous timing motor, the rotor has a cup or belt-shaped armature which is inverted so that the sides extend downward over the motor stator coil. The motor shaft has a relatively extended length and passes through the stator core so that the end thereof can support the upper end of the armature. As is known, such synchronous motors have a relatively high speed so that the lower end of the motor shaft must be connected to a speed reduction gear arrangement. The motor shaft is supported near its upper end at a bearing, which requires lubrication. Lubricant is supplied by capillary attraction to the bearing from a reservoir which also provides lubrication for the gear arrangement. Due to the relatively high shaft speed and continuous operation of the motor, it is known that substantial wear can occur if the shaft bearing is not amply lubricated by capillary attraction of the lubricant from the lubricant reservoir. The relatively long distance between the lubricant reservoir and the shaft bearing requires a critical capillary lubrication arrangement along the shaft support and bearing assembly for such motors.

In watt demand meter devices, the meter register mechanisms include a timing motor intended for extended operation substantially free of maintenance for many years. The meter devices with the timing motors are subjected to handling, transportation and storage and periodic removal from service for testing so that the devices are sometimes placed in an inverted position or position other than its normal upright operating position causing the motor and gear reduction lubricant to leak or seep from the outer end of the motor shaft support. Excessive discharge of the lubricant can interfere with the operation of other parts of the meter and also cause a dirty appearance due to an accumulation of lubricant on the meter glass cover.

In U.S. Pat. No. 2,668,086 a capillary lubrication system is disclosed for a motor bearing. The motor shaft is horizontal and is supported in a porous bearing. A sintered type of porous bearing is known to have a substantially shorter service life and not suitable for the continuous and more severe operation of the type experienced by vertical timing motors in demand meters. A wick is disclosed in the patent for transferring oil from a reservoir to a felt washer which in turn transfers oil by capillary attraction to the outside of the porous bearing. The wick does not deliver oil directly to the shaft and does not contact the shaft to direct oil by capillary attraction upward to the shaft bearing or to provide seepage protection when the motor shaft end is oriented down.

The U.S. Pat. Nos. 121,557; 308,579; and 552,702 disclose lubrication systems utilizing capillary attraction along wicks to direct lubricant to horizontal bearing supports utilized in railroad car journals. The U.S. Pat. No. 3,211,345 discloses a nylon thread wick to transfer a liquid to an evaporation surface.

Accordingly it is desirable to have a bearing lubrication system for vertical motor shafts of motors subjected to continuous and extended operation in diverse conditions and further subject to periodic movement during transportation, storage and periodical removal for test purposes wherein it is especially desired to have a lubrication system that is simply and effectively manufactured at low cost for reliable use over extended periods.

SUMMARY OF THE INVENTION

In accordance with the present invention a bearing lubrication system is provided for a timing motor having an extended vertical shaft and intended for use in driving timing mechanisms such as included in watt demand meter register mechanisms. The timing motor includes a housing and an extended vertical shaft supported therein. The bore of a hollow shaft support column extends through an upright stem portion of the motor housing. The upper end of the motor shaft is journaled in a solid and lubricant impervious bearing carried in the upper end of the bore and extends downward through the bore to a speed reduction gear train carried in the housing under the motor. An oil lubricant reservoir surrounds the gear train to provide lubrication thereto and also supply lubricant to the shaft bearing. An absorbent fiber washer is mounted around the shaft and below the bearing at the upper end of the shaft support bore. A wick is mounted in a channel formed in the cylindrical wall of the shaft support column so as to extend between the washer and the lubricant reservoir. The lubricant flows by capillary attraction up the wick to the absorbent washer. Capillary attraction carries the lubricant further upward between the shaft and the bearing. Positioning of the absorbent washer around and in contact with the shaft also aids in preventing lubricant seepage by gravity from the lubricant reservoir and down between the shaft and the bore when the motor is inverted.

In another aspect of the present invention a lubricant seepage barrier is provided by a wick formed around the motor shaft at the open end of the associated support column. The wick extends down and along the outer side of the shaft support column to a lubricant absorbent retainer. Upon inverted positioning of the motor, any lubricant discharged by seepage from the open end of the shaft support column is transferred by capillary attraction to the associated retainer to avoid uncontrolled discharge of the lubricant into the mechanism driven by or associated with the motor.

It is a general feature of the present invention to provide an improved lubrication system for extended vertical motor shafts subjected to severe and continuous use for many years. The improved lubrication system provides lubricant transfer by capillary attraction in a simple and reliable manner which is easily assembled during manufacture with a minimum of simple and inexpensive parts. It is a further feature of this invention to provide ease of manufacture and to secure positioning of a lubrication wick arrangement by mounting the wick in a channel extending along a vertical shaft support. These and other features of the present invention will become more apparent with the detail description of the drawings which are briefly described hereinafter.

DESCRIPTION OF THE PREFERRED EMBODIMENT

Figure 1:
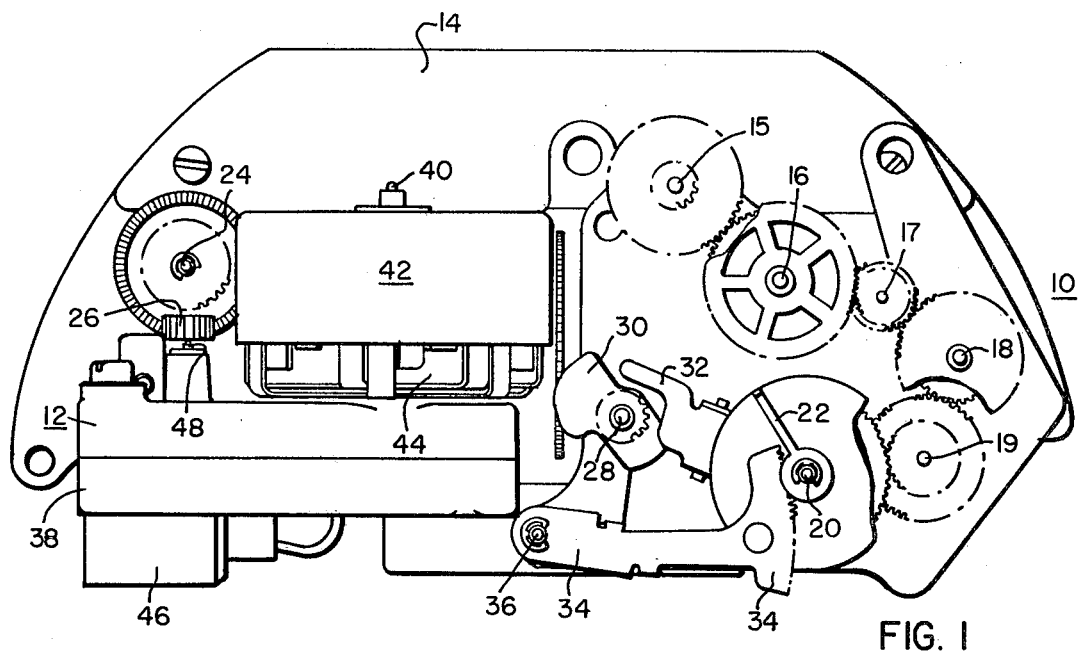
FIG. 1 is a front elevational view of a portion of a watt demand meter register including a timing mechanism driven by a timing motor having the lubrication system of this invention.

Referring now to the drawings and more particularly to FIG. 1 there is shown a portion of a register 10 of the watt demand meter having a synchronous timing motor 12 including the remote lubrication system made in accordance with this invention. The motor 12 is carried by a back plate 14 of the register mechanism which is typically detachably mounted to the frame of a conventional watthour meter device as is well understood by those skilled in the art. A demand gearing drives shafts 15, 16, 17, 18 and 19 in response to the consumption of electrical energy in watthours. The gears carried by the shaft 19 drive the shaft 20 and in turn an indicator pusher member 22 upscale at a rate corresponding to the rate of consumption of electrical energy. As understood in the art of watt demand metering, the pusher 22 must be returned to an initial or zero position and at the end of each demand interval which may be, for example, 15 or 30 minutes. The demand interval gearing includes a shaft 24 driven by the motor output pinion 26. Through intermediate demand interval gearing, not shown, the shaft 24 drives the cam shaft 28 which includes a cam 30. At the end of each demand interval time period the cam 30 is effective to operate a declutching trip member 32 and a sector gear 34 carried on the shaft 36 which drives the shaft 20 and associated pusher 22 to the initial or zero position. The aforementioned demand gearing and interval gearing arrangement do not form a part of this invention but are included for a better understanding of the present invention. The operation of watt demand meter registers intended to be driven by synchronous timing motors such as the motor 12 are described in U.S. Pat. Nos. 3,136,947; 3,207,985; 3,406,338; and 3,805,154 all assigned to the assignee of this invention and incorporated herein by reference.

The aforementioned watt demand meter devices are designed and intended to provide extremely high reliability with a minimum of maintenance for operation which may include an extended period of 25 to 30 years. In such operation it is apparent that the motor 12 must provide continuous operation so long as a meter device including the register 10 is in operation. For this reason the operation of the motor 12 must be equally or more than reliable as the remaining mechanisms provided in the meter device register 10.

Referring further to the general features of the motor 12, as shown in FIG. 1, an enclosed motor housing 38 is carried by the register plate 14 so that the pinion 26 meshes with a crown gear associated with the shaft 24. The housing 38 has a substantially liquid sealed interior. The motor rotor shaft 40 is supported by the housing 38, as described further hereinbelow, so as to carry the motor rotor 42 at the upper and outer end of the shaft 40. The rotor 42 has a generally cup or bell-shaped configuration having its closed bottom end oriented upward and attached to the upper end of the shaft 40. The rotor 42 includes hysteresis elements so that the rotor 42 defines an armature which is rotated in response to the excitation of a stator coil 44 mounted on the top of the housing 38. Electrical energization of the coil 44 is provided through a connector 46 carried on the bottom of the motor housing 38. The armature rotor 42 rotates at a constant speed of six hundred rpm. The speed of the motor shaft 40 is reduced, as briefly described hereinbelow, so that the shaft 48 carrying the pinion 26 rotates at a speed of approximately one rpm or fifteen fourteenths rpm in one embodiment.

Figure 2:
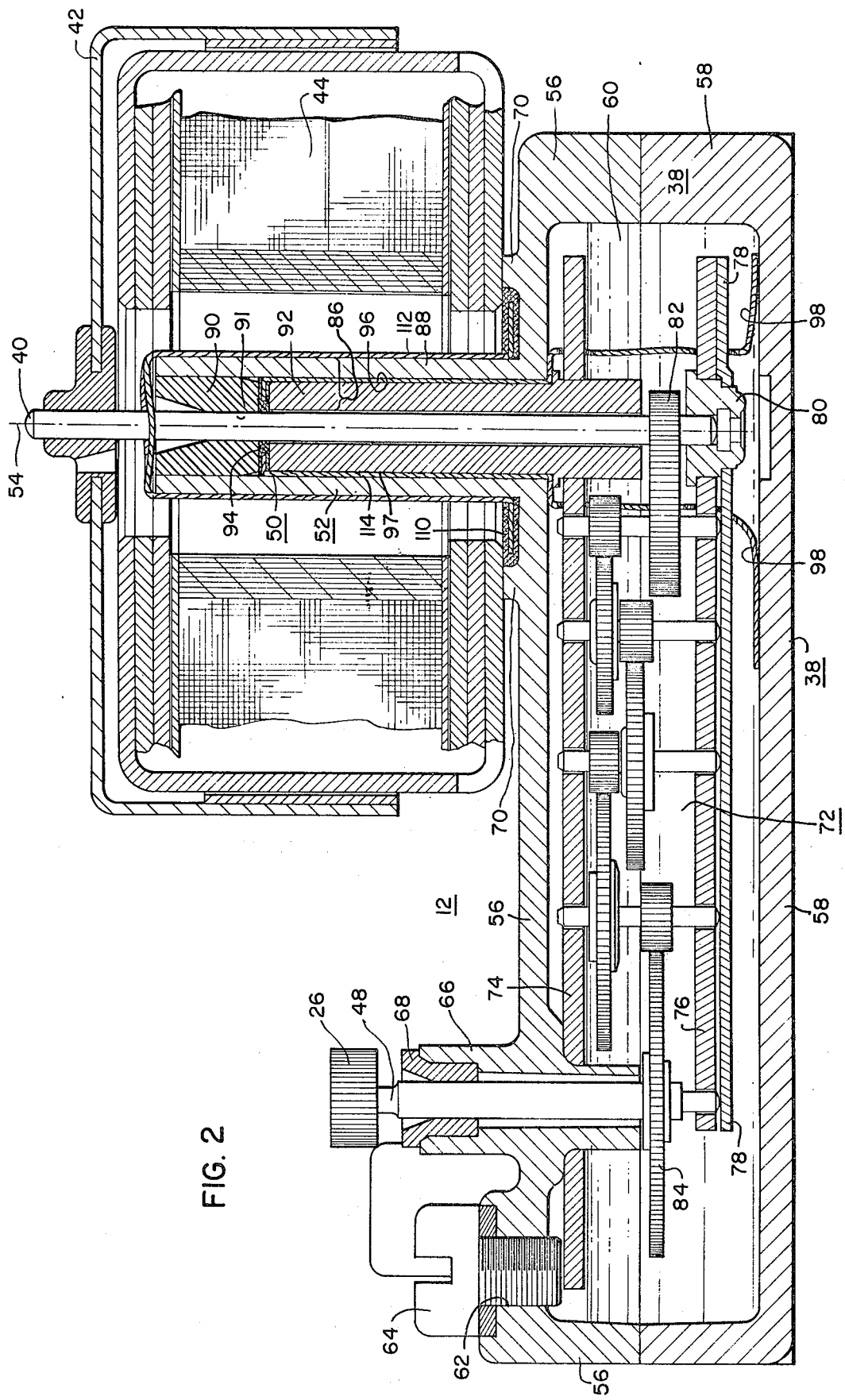
FIG. 2 is a front cross-sectional view of the timing motor shown in FIG. 1.

Referring now to FIG. 2 wherein there is shown a front cross-sectional view of the motor 12 a remote lubrication system 50, made in accordance with the present invention, is included in a support and bearing assembly 52 for rotatably supporting the rotation of the shaft 40 about a vertical axis 54. The motor housing 38 includes top and bottom cover parts 56 and 58, respectively, which are fastened together to form a sealed cavity within the interior 60 thereof. At the left of the top cover 56, a lubricant hole is included 62 and a cap 64 is threadably mounted to the hole 62 for applying an oil lubricant to a reservoir formed by the interior 60. A short stem 66 extends upright from the top cover 56 and therein is mounted a bearing 68 at the upper end thereof for rotationally supporting the output pinion shaft 48. An annular boss 70 extends upward from the cover 56 to support the bottom of stator coil 44. The motor shaft support and bearing assembly 52 is carried by the upper part of the top cover 56 and is described in more detail hereinbelow. The upper part of the shaft 40 extends above the assembly 52 to carry the rotor 42 relative to the stator coil 44 as described hereinabove.

Referring briefly to the interior 60 of the motor housing 38, therein is contained a speed reduction gear train 72 which does not form a part of the present invention. The shafts of the gear train 72 are journaled for rotation within the top and bottom plates 74 and 76. A thrust plate 78 is mounted below the bottom gear train support plate 76 to carry the bottom ends of the gear train shafts as well as the end of the output pinnion shaft 48. The motor shaft 40 is carried by a jewel thrust bearing assembly 80 also carried by the thrust plate 78. A pinion 82, carried on the bottom of the shaft 40, provides input to the speed reduction gear train 72 and the large gear 84 on the end of the shaft 48 provides the output of the gear train 72. The interior 60 defines a cavity or reservoir for oil lubricant which is applied through the hole 62 to maintain the meshing engagement of the gears of the gear train 72 shown in FIG. 2 immersed in the lubricant to produce high efficiency and long life in operation of the gear train 72. The oil within the interior 60 also provides lubricant for the remote lubrication system 50 included in the support and bearing assembly 52 as described hereinafter.

Figure 3:
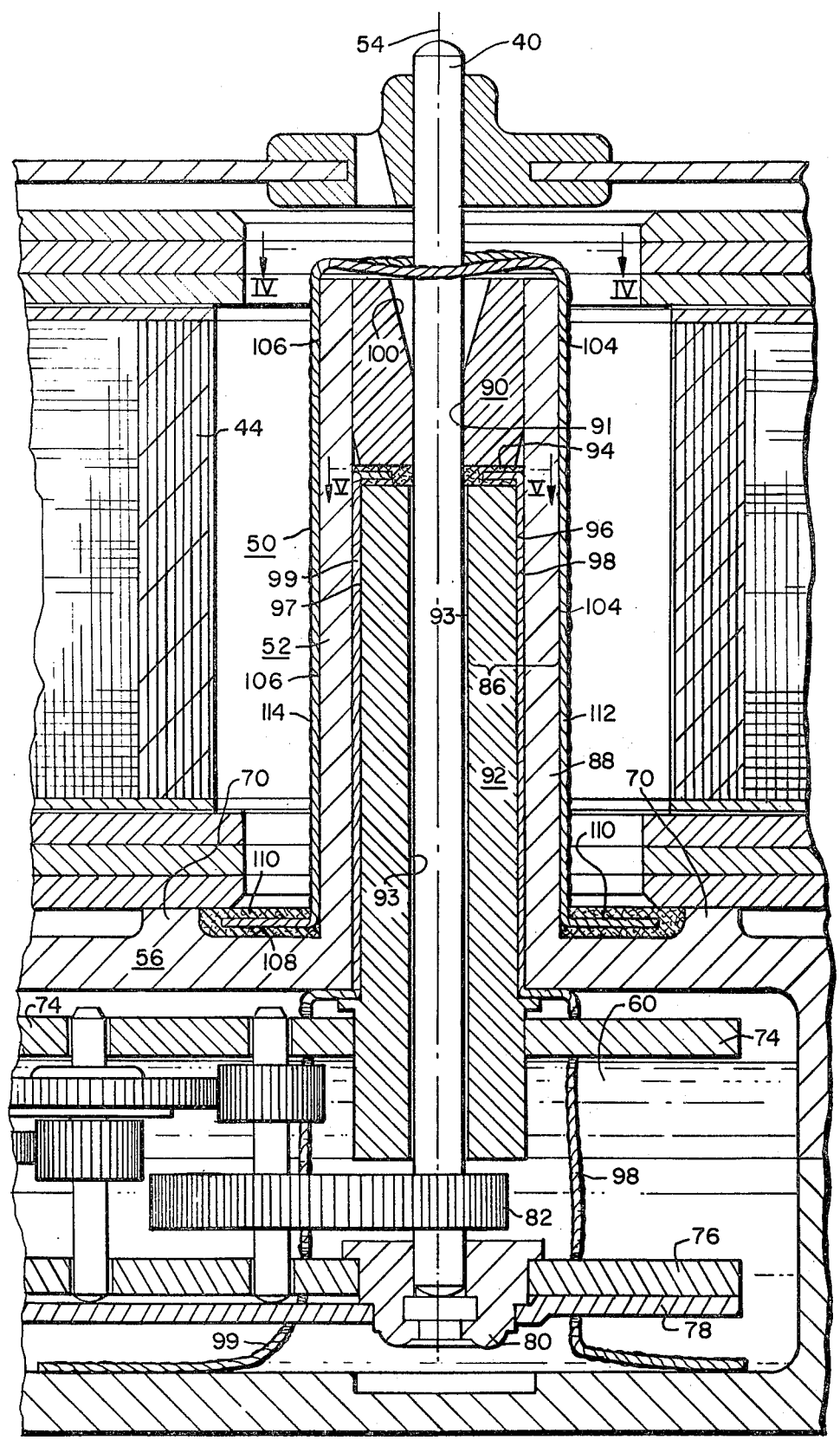
FIG. 3 is an enlarged fragmentary view of FIG. 2 including the remote lubrication system of this invention.

Referring now to FIG. 3 wherein there is shown an enlarged fragmentary portion of the cross-sectional view of FIG. 2, the shaft support and bearing assembly 52 includes an elongated shaft support column having a composite cylindrical wall 86. The outer portion of the cylindrical wall 86 includes a hollow stem 88 integrally upstanding from the top cover 56 so as to be surrounded by the stator coil 44. A solid bearing 90 is carried by the inner core of the stem 88 at the upper opened end thereof. The solid bushing 90 is formed of a solid bronze bearing material which is impervious to lubricant and is to be distinguished from porous bearings such as those made of a sintered bronze bearing material which have been found to be less reliable in use of the motor 12. A cylindrical shaft bearing surface 91 radially supports the shaft 40 for rotation about the vertical axis 54 when supporting the rotor 42. A bushing 92 is further supported in the core of the stem 88 and is spaced slightly below the bottom of the bearing 90. The bushing 92 extends into the interior 60 of the housing 38 and through the support plate 74 to terminate slightly above the pinion 82 carried at the bottom of the shaft 40. Thus, the bearing 90 and bushing 92 form the inner portion of the composite cylindrical wall 86.

A straight bore 93 of the bushing 92 receives the shaft 40 with a close clearance fit therebetween. The shaft 40 has a diameter in the order of 0.0576 inch (0.1146 cm.) and the bore 93 has a diameter in the order of 0.069 (0.175 cm.) and the overall length of the shaft is in ther order of 1.3 inches (3.3 cm.) with the height between the bottom of the bushing 92 and lower end of the bearing 90 being in the order of 0.75 inch (1.9 cm.). In prior art designs the bushing 92 extends to the bottom of the bearing 90 so that oil is directed by capillary attraction solely between the shaft 40 and the bore 93 to lubricate the bearing surface 91 and the portion of the shaft 40 journaled therein. The extended or substantial vertical height for such capillary attraction is large relative to the shaft diameter. The ratio of the shaft diameter to the length of the capillary flow between the bottom of the bushing 92 and the bearing 90 has a ratio of approximately one to thirteen. To maintain proper lubrication at the bearing 90 in the prior art design it is required that only critical dimensions be maintained in the shaft diameter and the diameter of the bore 93 to provide the reliable, continuous and extended service life of the motor 12.

The remote lubrication system 50 of the present invention is provided by a lubricant absorbent fiber washer 94 positioned between the bottom of the bearing 90 and the top of the bushing 92. The absorbent fiber washer 94 extends radially between the surface of the shaft 40 and the core of the stem 88. Diametrically opposite grooves or channels 96 and 97 are formed in the periphery of the bushing 92 and extend straight from the top thereof, adjacent the washer 94, to the interior 60 of the housing adjacently below the inner wall of the top cover 56. Two lubricant absorbent wicks 98 and 99 are disposed and held in place in the channels 96 and 97, respectively. The wicks are preferably made of a Nylon thread material. The upper ends of the wicks 98 and 99 are embedded in the washer 94 and the lower ends of the wicks extend from the channels 96 and 97 immediately below the inner side of the top cover 56 and depend therefrom around the outer sides of the plates 74, 76 and 78 and extend to the bottom of the housing interior 60 to rest on the bottom thereof provided by the inner side of the bottom cover 58. Alternatively, the channels 96 and 97 may be formed by die casting techniques in the core of the stem 88 immediately adjacent the illustrated locations of the channels disposed in the bushing 90.

Figure 5:
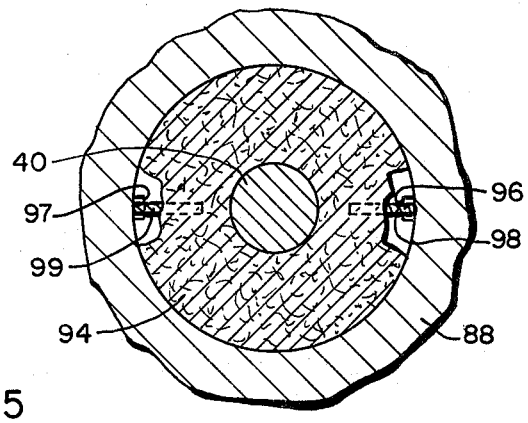
FIG. 5 is a cross-sectional view of FIG. 3 taken along the axis V—V and looking in the direction of the arrows.

The sectional view of FIG. 5 illustrates the embedded portion of the wicks 98 and 99 within the wick 94. Portions of the wick 94 are broken away in FIG. 5 showing the channels 96 and 97 with the wicks disposed therein.

In operation of the remote lubrication system 50 for lubricating the bearing surface 91 the lower ends of the wicks 98 and 99 absorb the oil lubricant within the reservoir of the interior 60 and the lubricant is transferred by capillary attraction upward along the wicks in the channels 96 and 97 to feed the lubricant to the washer 94. The lubricant filled washer presents the lubricant to the surface of the shaft 40 immediately below the solid bearing 90. Rotation of the shaft 40 and the capillary attraction occurring between the shaft and the bearing surface 91 draws the lubricant upward to maintain the shaft and bearing surfaces flooded with the lubricant. As shown in FIGS. 2 and 3, the upper end of the bearing surface diverges outwardly to form a hollow conical reservoir 100 for collecting excess lubricant which is passed beyond the bearing surface 91 so that gravity will force some of the excess lubricant on a return path to the bearing surface 91 during normal upright vertical operation of the motor 12.

Figure 4:
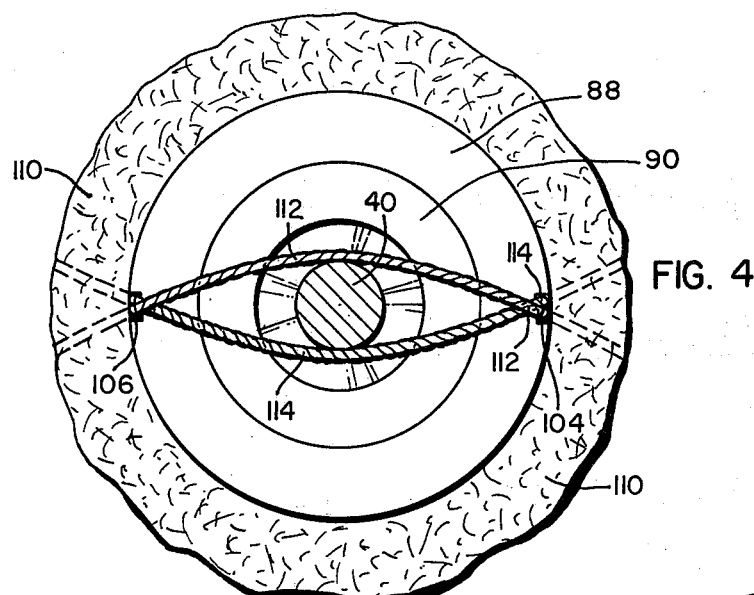
FIG. 4 is a cross-sectional view of FIG. 3 taken along the axis IV—IV and looking in the direction of the arrows.

A lubricant seepage barrier arrangement of the lubrication system 50 is also shown in FIGS. 2 and 3 and in the top cross-sectional view of FIG. 4. The outer side of the stem 88 has a pair of diametrically opposite grooves or channels 104 and 106 extending parallel to the axis of the stem coinciding with the axis 54 and between the upper end thereof and the annular recess 108 formed radially inward of the annular boss 70 and the outside of the stem 88. A liquid absorbent retainer 110 is carried within the annular recess 108 and may be formed by a washer made of a fiber material such as that forming the absorbent washer 94.

A pair of wicks 112 and 114, shown more clearly in FIGS. 3 and 4, extend from embedded relationships within the absorbent retainer 110 upward within the channels 104 and 106 and are formed in crossing relationship at the top end of the stem 88 to bear against the shaft 40 beyond the open end of the composite cylindrical wall 86. The wicks 112 and 114 are preferably formed of a Nylon thread material as are the wicks 98 and 99. As noted hereinabove, during transportation and use of a demand meter having the register 10 it is often moved and subject to being turned on its side or upside down. Gravity tends to force lubricant from the housing interior 60 down the shaft 40 and outward from the bearing surface 91 to discharge the lubricant from the motor 12. The wicks 112 and 114 absorb the lubricant discharged from the end of the shaft support column and transfer, by capillary attraction, the lubricant leaked from the shaft 40 back along the channels 104 and 106 to the absorbent retainer 110.

It is to be understood that the orientation of the motor 12 will be inverted from that shown in FIGS. 3 and 4 for operation of the seepage barrier including the arrangement of the wicks 112 and 114 and the absorbent retainer 110 as described hereinabove. The use of the seepage barrier arrangement in addition to the bearing surface lubrication arrangement described hereinabove provides a simple and efficient lubrication system for assuring proper lubrication of the shaft 40 and adjacent bearing surface 91 during normal upright vertical operation of the motor 12. Discharge of the lubricant into the mechanisms of a meter device including the motor 12 is prevented when it is stored or positioned in an inverted position for any extended period of time. It is to be further noted that the use of the lubrication system 50 does not require the close tolerances to be maintained between the shaft diameter and the shaft receiving bore 93 although if such tolerances are maintained and a critical clearance therebetween is provided, an auxiliary path will be provided for lubrication through the bore 93 by capillary attraction to the absorbent washer 94 and to the bearing surface 91.

It is understood by those skilled in the art that other modifications and changes to the preferred embodiment of the remote lubrication system 50 as described hereinabove may be made without departing from the spirit and scope of this invention.

I claim:

1. A remotely lubricated support and bearing assembly for extended and vertically rotatable shafts, comprising:

an enclosed housing having an interior reservoir for receiving a lubricant;

an elongated hollow cylindrical wall extending from the top of said housing, said cylindrical wall surrounding a vertical bore extending therethrough and to the interior of said enclosed housing;

a solid bearing member carried by the upper end of said cylindrical wall and including a cylindrical shaft bearing surface aligned with said bore;

a lubricant absorbent washer carried within said cylindrical wall and adjacently below said bearing member;

an internal channel extending through said cylindrical wall between said washer and the interior of said enclosed housing;

a wick extending through said channel for transferring lubricant from said interior reservoir to said absorbent washer so that the lubricant is distributed upward by capillary attraction from said washer to said shaft bearing surface when said shaft is mounted within said bearing member and said bore for rotation about a substantially vertical axis;

a lubricant absorbent retainer mounted outside the bottom of said cylindrical wall; and a further wick extending over the outer end of said cylindrical wall and around said shaft and further extending to said lubricant absorbent retainer for directing lubricant discharge from the end of the cylindrical wall when the support and bearing assembly is inverted.

2. A remotely lubricated support and bearing assembly as claimed in claim 1 including two channels within said cylindrical wall and extending between said absorbent washer and the interior of said enclosed housing and further including two such wicks as said first named wick each extending in a separate one of said channels between said absorbent washer and the interior of said housing.

3. A remotely lubricated support and bearing assembly as claimed in claim 2 including a pair of diametrically opposite channels extending along the outside of said cylindrical wall between the outer end thereof and said lubricant absorbent retainer and further including two such wicks as said further wick disposed in said diametrically opposite channels and extending between said lubricant absorbent retainer and in contact with a portion of said shaft extending beyond the outer end of said cylindrical wall.

* * * * *